(12) United States Patent
Mischo

(10) Patent No.: US 9,082,462 B2
(45) Date of Patent: Jul. 14, 2015

(54) METHODS AND SYSTEMS FOR ADDRESSING MEMORY WITH VARIABLE DENSITY

(71) Applicant: Infineon Technologies AG, Neubiberg (DE)

(72) Inventor: Walter Sebastian Mischo, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/060,794

(22) Filed: Oct. 23, 2013

(65) Prior Publication Data

US 2015/0098292 A1 Apr. 9, 2015

Related U.S. Application Data

(60) Provisional application No. 61/887,650, filed on Oct. 7, 2013.

(51) Int. Cl.
| | |
|---|---|
| *G11C 8/00* | (2006.01) |
| *G11C 11/408* | (2006.01) |
| *G06F 12/00* | (2006.01) |
| *G06F 12/06* | (2006.01) |
| *G06F 12/02* | (2006.01) |
| G11C 29/18 | (2006.01) |
| G06F 3/06 | (2006.01) |

(52) U.S. Cl.
CPC ........ *G11C 8/00* (2013.01); *G06F 12/00* (2013.01); *G06F 3/0644* (2013.01); *G06F 12/0615* (2013.01); *G11C 11/408* (2013.01); *G11C 29/18* (2013.01)

(58) Field of Classification Search
CPC ........ G11C 8/00; G11C 29/18; G11C 11/408; G06F 12/00; G06F 3/0644; G06F 12/0615
USPC .......................................... 365/230.01; 711/2
See application file for complete search history.

(56) References Cited

U.S. PATENT DOCUMENTS

| | | | |
|---|---|---|---|
| 5,093,805 A * | 3/1992 | Singh | 365/51 |
| 5,691,949 A * | 11/1997 | Hively et al. | 365/230.03 |
| RE37,613 E * | 3/2002 | Savage | 710/9 |
| 6,560,450 B1 * | 5/2003 | Rosenberg et al. | 455/316 |

* cited by examiner

*Primary Examiner* — Ly D Pham
(74) *Attorney, Agent, or Firm* — Eschweiler & Associates, LLC

(57) ABSTRACT

Embodiments relate to systems and methods for simplified addressing of a memory device whose total memory capacity is extendible by an additional memory capacity or a factor to a total extended memory capacity, the method comprising dividing the additional memory capacity into a set of binary memory fractions of the total memory capacity such that a sum of all binary memory fractions equals the additional memory capacity, and addressing each one of the binary memory fractions by a binary based addressing scheme.

13 Claims, 5 Drawing Sheets

METHODS AND SYSTEMS FOR ADDRESSING MEMORY WITH VARIABLE DENSITY

REFERENCE TO RELATED APPLICATION

This application claims priority to U.S. provisional application No. 61/887,650 filed on Oct. 7, 2013.

BACKGROUND

The present disclosure relates generally to methods and systems for addressing memory with variable density, and—in particular—to flexible and efficient addressing schemes for non-volatile memory with variable memory density, in other words, memory with selectable memory capacity. In the following, for illustration purposes, the invention will be described with reference to addressing schemes for NOR-flash memory. However, the disclosure is not so limited and may find its application in conjunction with addressing memory with variable density based on other memory technologies.

Advanced concepts for a NOR-flash memory architecture assume that—besides the conventional way of storing information in the form of one bit per memory cell/flash cell (storage location)—also multiple bits, for example three bits, may be stored in two memory cells. However, in some applications, both concepts with a first memory density of one bit per memory cell and a second memory density of p bits stored in q memory cells with p>q should be implemented in the same hardware such as the same integrated circuit device. In other words, the extension of the memory capacity based on choosing the second memory density or second memory capacity in the same memory device should be selectable during operation.

This selectability in the same memory device results in problems with implementing simple addressing schemes for both, a first operation mode of the memory device with the first memory density or first memory capacity and at least one second operation mode of the memory device with at least the second memory density or second memory capacity.

Hence, systems and methods for simplifying an addressing scheme for a memory device with selectable or variable memory density would be desirable.

SUMMARY

Methods and systems for addressing memory with variable density are provided, substantially as shown in and/or described in connection with at least one of the figures, as set forth more completely in the claims.

Further features and advantages of embodiments will become apparent from the following detailed description made with reference to the accompanying drawings.

BRIEF DESCRIPTION OF THE DRAWINGS

The accompanying drawings are included to provide a further understanding and are incorporated in and constitute a part of this specification. The drawings relate to examples and embodiments and together with the description serve to explain the principles of the disclosure. Other embodiments and many of the intended advantages of embodiments will be readily appreciated as they become better understood by reference to the following detailed description.

Figure 3:
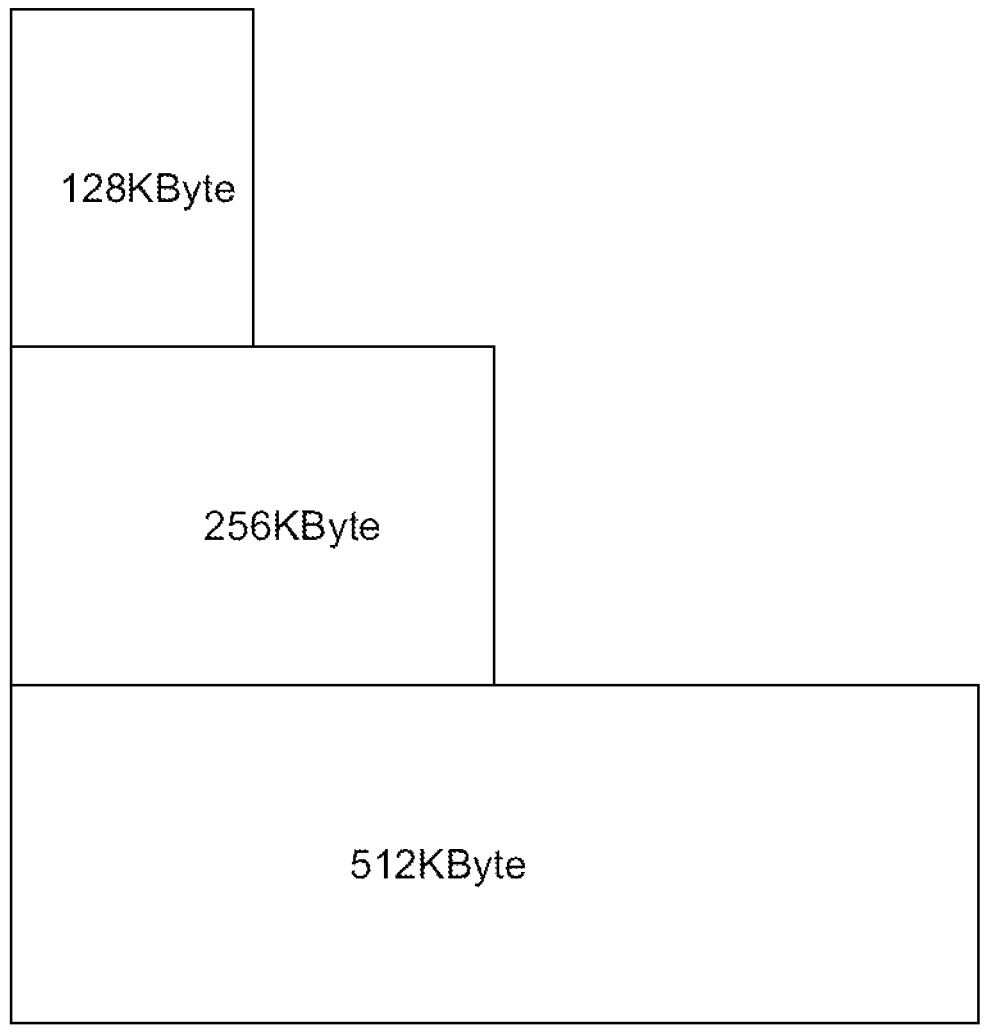
Figure 4:
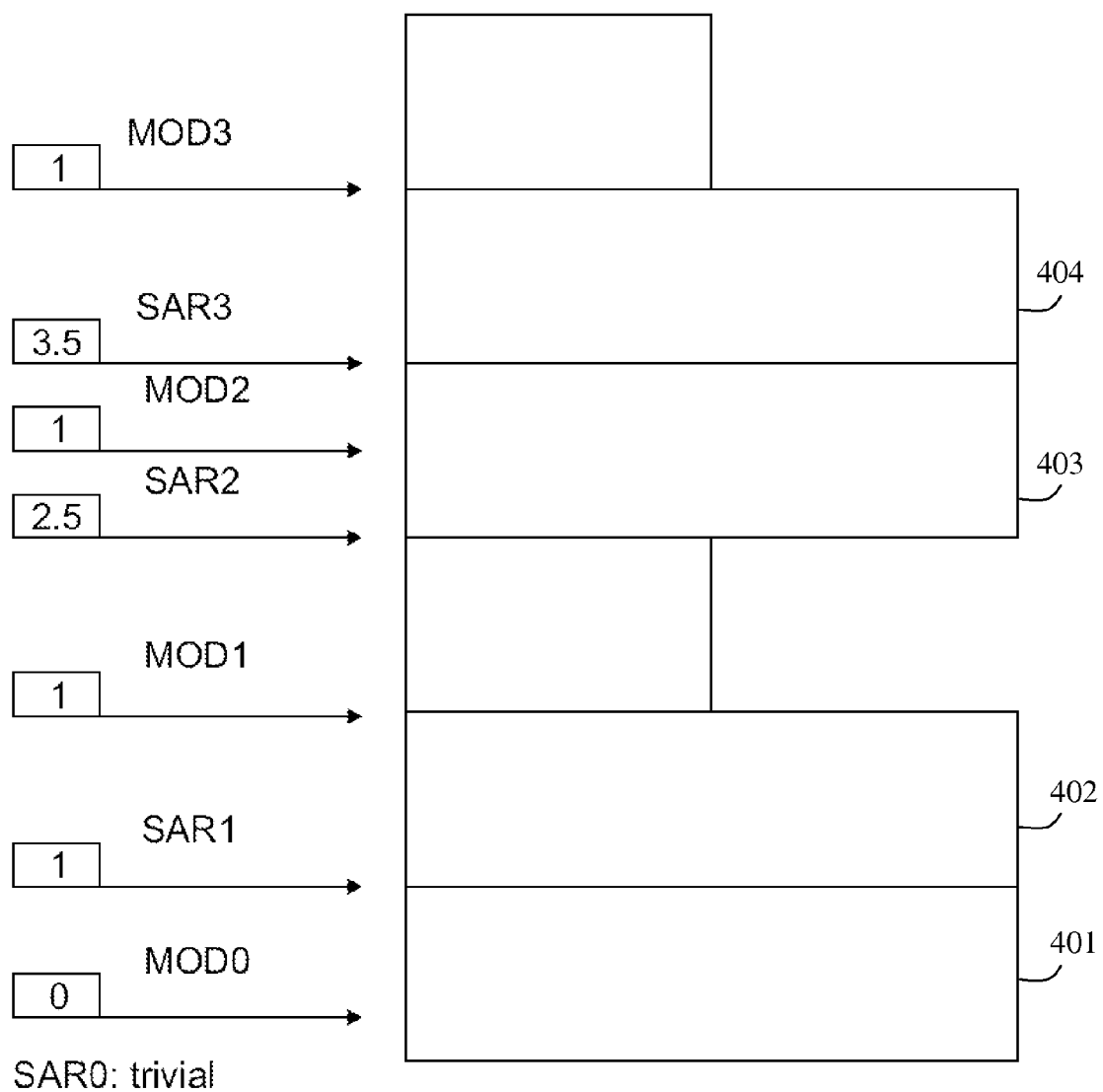
Figure 5:
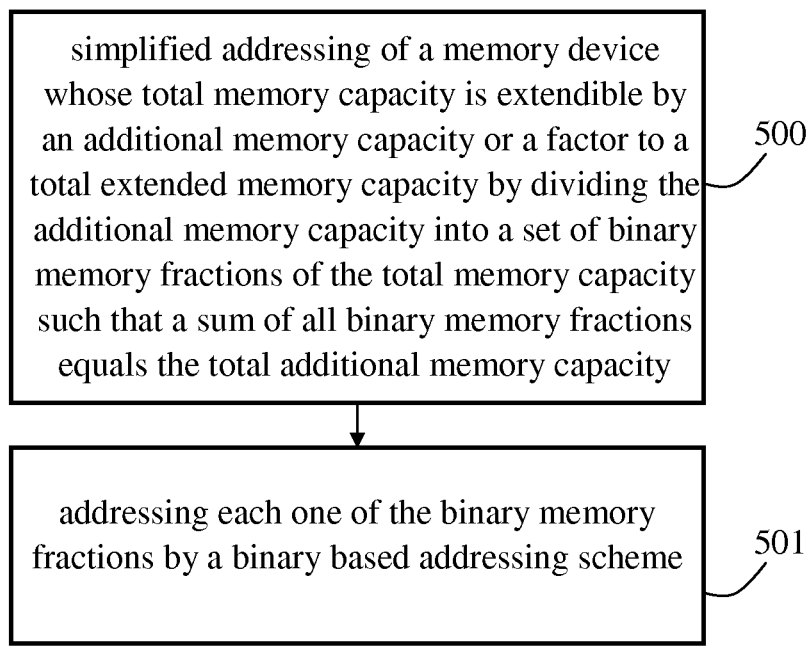

to a total extended memory capacity of 768 Kbytes, wherein the additional memory capacity of 256 Kbytes is divided into a binary memory fraction of 256 Kbytes of the total memory capacity of 512 Kbytes such that the binary memory fraction of 256 Kbytes equals the additional memory capacity of 256 Kbytes;

FIG. 3 shows a schematic visualization of a simplified addressing scheme for a memory device whose total memory capacity of 512 Kbytes is extendible by an additional memory capacity of 384 Kbytes or an improper fraction of $$\frac{p}{q} = \frac{7}{4}$$

to a total extended memory capacity of 896 Kbytes, wherein the additional memory capacity of 384 Kbytes is divided into a set of binary memory fractions of 256 Kbytes and 128 Kbytes of the total memory capacity of 512 Kbytes such that sum of the binary memory fractions of 256 Kbytes plus 128 Kbytes equals the additional memory capacity of 384 Kbytes;

FIG. 4 shows an embodiment of a memory device with plurality of sectors wherein a memory capacity of each sector is selectable according to a modus register; and FIG. 5 shows a flow diagram of a method for simplified addressing of a memory device whose total memory capacity is extendible by a factor to a total extended memory capacity.

DETAILED DESCRIPTION

In the following Detailed Description, reference is made to the accompanying drawings, which form a part hereof, and in which are shown by way of illustration specific embodiments. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

In the context of this application, a memory or a memory device may be a device which may provide for each input address A a dedicated output O. The outputs O may typically be bound to a predetermined range of values D which may be handled by further processing stages. Generally, NOR-structured memory devices may involve the implementation of the memory device as a two-dimensional storage matrix with binary values as matrix entries. In this case, the columns of the storage matrix may correspond to bitlines, and the rows of the storage matrix may correspond to wordlines. The wordlines and bitlines may enable electrical access to the memory cells which may correspond to the matrix entries of the storage matrix.

In the following, an addressing scheme will be described for the case of a conventional memory architecture wherein one bit is stored per memory cell. However—in order to already introduce the integer numbers of p and q to describe the memory density or memory capacity increased by the factor $$\frac{p}{q}$$

per wordline in advanced memory architectures, it is assumed that q may represent sets of q memory cells per wordline and p≥q represents the information content of one set of q memory cells in bits. In these terms, the conventional memory architecture may be described in that every set of q=1 memory cell of a wordline stores p=1 bit of information content.

In this simple case of a single bit storage, a memory cell of a two-dimensional storage matrix with W wordlines and B bitlines may be addressed in the following way:

For an address A of the memory cell in the resulting storage matrix of size W in one dimension—which physically corresponds to the number of wordlines—and size B in the other dimension—which physically corresponds to the number of bitlines—the following holds true for a valid address with 0≤A≤B·W−1:

The wordline address WA may be defined by the integer division of A divided by B, i.e. WA=A div B, while the bitline address BA may be defined by the remainder of the integer division of A divided by B, i.e. BA=A mod B.

In other words, the memory which may be regarded as physically organized by the crossing points of the W wordlines and the B bitlines that enable electrical access to the memory cells located at the crossing points may be interpreted as the two-dimensional matrix A(W,B), whose matrix elements may take a predetermined set of values, namely {0, . . . , D−1}, wherein most commonly D equals 2 in the case of binary values for the matrix elements.

Furthermore and typically, the number of wordlines W and the number of bitlines B may be chosen to equal integer powers of 2 (i.e. W=$2^w$ and B=$2^b$) so that the above-mentioned integer division operations (div and mod) in the typical numerical representation to the base 2 need not to be performed by arithmetic logic units but may be carried out by a mere selection of parts of the address A in a binary representation. A choice of W=$2^w$ is convenient for multiple sector memories as shown in FIG. 4.

In case the above-mentioned limitation to a memory with 1 bit per memory cell storage density is dropped, instead of a single memory cell, N memory cells of a wordline should be read out simultaneously, wherein N—in turn—may be chosen to equal an integer power of 2 (i.e. N=$2^n$) in general. The unit of the N memory cells that may be read out of a wordline simultaneously may also be referred to as an N-bit word.

Thus, operating the same memory device selectably with a first memory density, i.e. a total memory capacity of C=W·B bits in a first operation mode, or with at least one second, different memory density, i.e. a total extended memory capacity of $$C_e = W \cdot \left(\frac{p}{q} \cdot B\right)$$

bits in at least one second operation mode with q=$2^k$, q<p<2q may be linked to varying the width of the words that are read out of a wordline, namely 1-bit words in the first operation mode and N-bit words in the at least one second operation mode.

For reasons of increasing the correctability of hardware errors due to manufacturing defects in a memory device, the N bits of an N-bit word are typically not assigned to memory cells that are addressed by physically neighboring bitlines. Rather, the assignment of the N bits of an N-bit word to bitlines may be scrambled over the wordline, and insofar arbitrary but, of course the same over all wordlines.

Furthermore, embodiments are possible wherein for reasons of reliability of the memory device, the width of a word may be increased to P>N bits to provide some redundancy for error-correcting code schemes. Also in that case, the valid address A of a memory cell may be still part of the range 0≤A≤W·B−1. Although the dimension of the storage matrix is then increased to $$W \cdot \left(B + \frac{(P-N) \cdot B}{N}\right),$$

the above mentioned addressing scheme may still be used if the selection of the P-bit words is derived from the selection of the N-bit words, i.e. the matrix A(W,B) becomes A(W, $$\left(B + \frac{(P-N) \cdot B}{N}\right)).$$

If it is desired that in a memory device—that is based on a storage matrix of dimension W·B—more information is to be written into addressable memory cells in the second operation mode, a problem arises with regard to addressing insofar as the contained information is to be addressed differently than the storing structure with its storage matrix of W·B. This problem is based on the fact that the basic matrix organization of the memory device will typically be kept, but the organization of the stored information may change. Thus, without further means, a conversion between the addressing scheme of the storage matrix and the addressing scheme of the information matrix would be required, which may cause computational effort and—hence—problems regarding the access time to the memory.

Moreover, additional memory cells to provide the increased total extended memory capacity in the second operation mode are, in one embodiment, arranged along the wordlines of the original storage matrix. As a result, the number of wordlines W for the second operation mode will typically not change. Hence, the resulting N memory cells of the N-bit word for the second operation mode will typically also be arranged on the same wordline, but not necessarily at crossing points of the wordline with neighboring bitlines for reasons of the above mentioned scrambling functionality. Arithmetically, the extension of the memory capacity results from storing $$\frac{p}{q}.$$

B bits along a wordline instead of 1·B bits. An extension to the above-mentioned P-bit words with redundancy may be carried out analogously.

Returning to the storage matrix, the matrix A(W,B) or its extension comprises matrix elements which may take the predetermined set of values, namely $\{0, \ldots, D-1\}$, wherein D may be considered as a function of $$\frac{p}{q}.$$

Now for each access to matrix A(W,B), a well defined selection procedure may be created, which selects N memory cells of the same wordline (i.e. row of the storage matrix) and converts the contained information so that an information results that corresponds to the range that may be expressed by the information content within the N memory cells, namely p bits. In other words, the N pieces of information that are read out of the N memory cells may be regarded as numbers to the base D. Possibly, certain value combinations read out of the N memory cells may be disregarded.

In the following example, each N=2 memory cells contain p=3 bits of information and the values in the range {0, 1, 2} read out of the memory cells present numbers to the base D=3. In Table 1 corresponding to the example—possible value combinations that are read out of N=2 memory cells are shown together with their correspondingly assigned information values that range from 0 to 7. Thus, the information values may represent the p=3 bits of information. In the example in Table 1, the value combination of "1" and "1" is disregarded for acquiring the appropriate number of $2^p=8$ value combinations that may be assigned to the information values that range from 0 to 7.

TABLE 1

| Values read out of N = 2 memory cells | | assigned information value |
|---|---|---|
| 0 | 0 | 0 |
| 0 | 1 | 1 |
| 0 | 2 | 2 |
| 1 | 0 | 3 |

TABLE 1-continued

| Values read out of N = 2 memory cells | | assigned information value |
|---|---|---|
| 1 | 1 | not assigned |
| 1 | 2 | 4 |
| 2 | 0 | 5 |
| 2 | 1 | 6 |
| 2 | 2 | 7 |

In the following, a simple example of a two-dimensional memory array is shown for the following values $B=8=2^3$, $W=4=2^2$, $N=2=2^1$, $P=3$ and—at first—$p=q=1$. Then, the total memory capacity without the redundancy of P−N=1 bit per word corresponds to $W \cdot B=2^5$ or $2^4$ N-bit words, thus also $2^4$ P-bit words. Hence, to address the P-bit words, 5 digits are needed in the binary system, of which the 2 upper bits may represent the wordline address and the remaining 3 lower bits may represent the bitline addresses of the P-bit word.

For the above-mentioned reasons of increased correctability, for the distribution of the bits of a P-bit word it may be assumed that the bits may be arranged along the wordlines at the positions 4·i+j wherein $$i \in \{0, \ldots, P-1\} \text{ and } j = \left(\frac{A}{N}\right)$$

mod 4 for the P-bit word. This strategy of the resulting farthest distribution of the bits of the P-bit words corresponds to a usual means, since error correction schemes benefit from this farthest distribution.

Table 2 shows the resulting distribution of the bits of the P-bit words, wherein the first value in each entry of Table 2 corresponds to the address A div N, and the second value in each entry, to the number of the bit of the P-bit word out of the range $\{0, \ldots, P-1\}$.

TABLE 2

| | BA | | | | | | | | | | | |
|---|---|---|---|---|---|---|---|---|---|---|---|---|
| WA | 0 | 1 | 2 | 3 | 4 | 5 | 6 | 7 | 8 | 9 | 10 | 11 |
| 0 | 0 0 | 1 0 | 2 0 | 3 0 | 0 1 | 1 1 | 2 1 | 3 1 | 0 2 | 1 2 | 2 2 | 3 2 |
| 1 | 4 0 | 5 0 | 6 0 | 7 0 | 4 1 | 5 1 | 6 0 | 7 1 | 4 0 | 5 2 | 6 0 | 7 2 |
| 2 | 8 0 | 9 0 | 10 0 | 11 0 | 8 1 | 9 1 | 10 1 | 11 1 | 8 1 | 9 2 | 10 1 | 11 2 |
| 3 | 12 0 | 13 0 | 14 0 | 15 0 | 12 1 | 13 1 | 14 2 | 15 1 | 12 2 | 13 2 | 14 2 | 15 2 |

The P-bit word with the address A div N=11 is highlighted in Table 2. Its bits may be addressed via $$WA = (A \, div \, N) \, div\left(\frac{B}{N}\right)$$

thus 11 div 4=2 for the wordline address WA, and BA=4·i+(11 mod 4)=4·i+3 for i∈{0, 1, 2} for the bitline address BA of the bits within the P-bit word. In the example in Table 2 with p=q=1, three memory cells are needed to represent the 3-bit P-bit word. Moreover, in the example of Table 2, each wordline may store four P-bit words, for instance, the first wordline with the wordline address WA=0 stores the three bits of the word with the address A div N=0 at bitline addresses BA=0 ("0 0"), BA=4 ("0 1") and BA=8 ("0 2").

Now, if p is chosen as p=3 and q is chosen as q=2 for a memory with an increased memory density, for each P-bit word only two instead of the above three memory cells are needed, whose information content must be accordingly higher as shown in Table 1. Hence, in the corresponding example, the resulting Table 3 shows that each wordline may store 6 P-bit words, for instance the first wordline with the wordline address WA=0 stores the 3 bits of information of the word with the address A div N=0 at bitline addresses BA=0 ("0 0") and BA=6 ("0 1"). Moreover, Table 3 shows a first approach according to an example to distribute the bits of the 6 P-bit words per wordline also according to the farthest distribution strategy.

TABLE 3

| WA\BA | 0   | 1   | 2   | 3   | 4   | 5   | 6   | 7   | 8   | 9   | 10  | 11  |
|-------|-----|-----|-----|-----|-----|-----|-----|-----|-----|-----|-----|-----|
| 0     | 0 0 | 1 0 | 2 0 | 3 0 | 4 0 | 5 0 | 0 1 | 1 1 | 2 1 | 3 1 | 4 1 | 5 1 |
| 1     | 6 0 | 7 0 | 8 0 | 9 0 | 10 0| 11 0| 6 1 | 7 1 | 8 1 | 9 2 | 10 1| 11 1|
| 2     | 12 0| 13 0| 14 0| 15 0| 16 0| 17 0| 12 1| 13 1| 14 1| 15 1| 16 1| 17 1|
| 3     | 18 0| 19 0| 20 0| 21 0| 22 0| 23 0| 18 1| 19 1| 20 1| 21 1| 22 1| 23 1|

However, Table 3 also shows that as a result of this straightforward farthest distribution strategy, the P-bit word with the address A div N=11 that is also highlighted in Table 3, is arranged on a different wordline than in Table 2, namely on the wordline with the wordline address WA=1 in Table 3 instead of in the wordline with the wordline address WA=2 as in Table 2. In the example in Table 3, the bits of the word A div N=11 may be addressed via the integer part of $$WA = int\left(\left(\frac{q}{p}\right)(AdivN)div\left(\frac{B}{N}\right)\right)$$

thus $$WA = int\left(\left(\frac{2}{3}\right)11 div 4\right) = 1$$

for the wordline address WA. In this example, it is the contained divisor of p=3 in the conversion between the addressing scheme of the storage matrix and the addressing scheme of the information matrix, which would cause computational effort and hence problems regarding the access time to the memory. According to literature, such division may only be replaced by a multiplication with higher bit resolution and hence increases the complexity.

However, in a second approach according to an embodiment as shown in Table 4, the entries of Table 3 are rearranged such that words up to words with the address A div N=15—which was the highest address of a word in Table 2—are arranged in merely a lower $$\frac{2}{3}$$

fraction of the full storage matrix between bitline address BA=0 and bitline address BA=7, whereas words between the word with address A div N=16 and the word with address A div N=23 are arranged in an upper $$\frac{1}{3}$$

fraction of the full storage matrix between bitline address BA=8 and bitline address BA=11.

TABLE 4

| WA\BA | 0   | 1   | 2   | 3   | 4   | 5   | 6   | 7   | 8   | 9   | 10  | 11  |
|-------|-----|-----|-----|-----|-----|-----|-----|-----|-----|-----|-----|-----|
| 0     | 0 0 | 1 0 | 2 0 | 3 0 | 0 1 | 1 1 | 2 1 | 3 1 | 16 0| 17 0| 16 1| 17 1|
| 1     | 4 0 | 5 0 | 6 0 | 7 0 | 4 1 | 5 1 | 6 1 | 7 1 | 18 0| 19 0| 18 1| 19 1|
| 2     | 8 0 | 9 0 | 10 0| 11 0| 8 1 | 9 1 | 10 1| 11 1| 20 0| 21 0| 20 1| 21 1|
| 3     | 12 0| 13 0| 14 0| 15 0| 12 1| 13 1| 14 1| 15 1| 22 0| 23 0| 22 1| 23 1|

As a result, the highlighted word with the address A div N=11 as well as other words of the example in Table 2 with p=q=1 are arranged on the same wordline with wordline address WA=2 again with respect to the example in Table 2. Even the bitline addresses of the bits of the word with the address A div N=11 are the same, namely BA=3 and BA=7 with respect to the two lower bits of the word with the address A div N=11 in Table 2.

However, in the embodiment according to Table 4, for words between the word with address A div N=16 and the word with address A div N=23—which only appear as a result of the extension of the total memory capacity with p=3 and q=2—now a modified address calculation applies. The wordline address may be determined by $$WA = \left((AdivN) - \left(\frac{W \cdot B}{2N}\right)\right) div\left(\frac{B}{2N}\right),$$

e.g. for the word with the address A div N=21, it results that WA=(21−16) div 2=2. Also, the calculation of the bitline address BA of the bits within words between the word with address A div N=16 and the word with address $$AdivN =$$

21 is modified as $BA = \left(B + \left(\frac{B}{2N}\right) \cdot i\right) + \left((AdivN) - \left(\frac{W \cdot B}{2N}\right)\right) \bmod\left(\frac{B}{2N}\right) =$ $$8 + 2 \cdot i + (21 - 16) \bmod 2.$$

The latter expression leads to BA=9 for the first memory cell of the word with address A div N=21 (i=0) and BA=11 for the second memory cell of the word with address A div N=21 (i=1). Since almost all terms in the modified calculations to determine wordlines and bitlines of the additional memory capacity between bitline addresses BA=8 and BA=11 are powers of 2, the arithmetical effort is greatly reduced compared to the case in Table 3 with the straightforward distribution of the words that represent the additional memory capacity and the then required division by 3.

In the following, it is referred to FIGS. 1a, 1b and 2 that seek to visualize the modified address calculations when extending the total memory capacity by an improper fraction such as $$\frac{p}{q} = \frac{3}{2}.$$

Figure 1A:
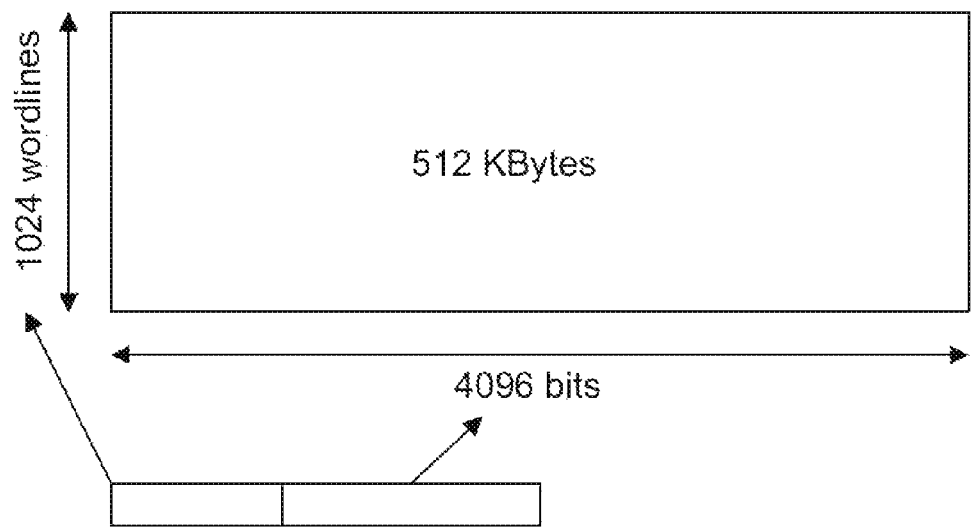
FIG. 1a shows a schematic view of a memory block or array with W=1024 wordlines and B=4096 bitlines and a memory density of 1 bit per memory cell, i.e. 4096×1 bits per wordline according to a conventional memory architecture.
Figure 1B:
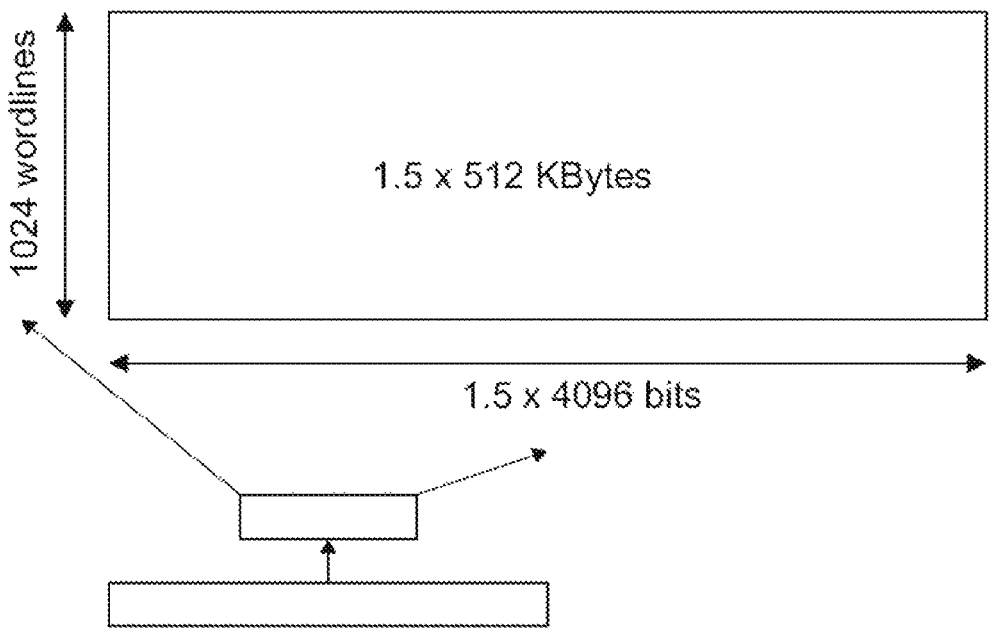
FIG. 1b shows a schematic view of a memory block or array with W=1024 wordlines and B=4096 bitlines and a memory density of 1.5 bits per memory cell, i.e. 4096×1.5 bits per wordline according to an advanced memory architecture.

In this regard, FIG. 1a shows a memory block with W=1024=$2^{10}$, B=512·8=$2^{12}$=4096 when operated in the first operation mode, wherein each memory cell stores 1 bit of information. As a result, the memory block in FIG. 1a has a total memory capacity of W·B=1024·4096 bits=512 Kbytes. In contrast to that, FIG. 1b shows a memory block with W=1024=$2^{10}$, B=512·8=$2^{12}$=4096 when operated in the second operation mode, wherein each memory cell stores $$\frac{p}{q} = \frac{3}{2} = 1.5$$

bit of information. As a result, the memory block in FIG. 1b has a total memory capacity of W·B=1024·4096·1.5 bits=768 Kbytes. As shown above, the conversion between storage matrix address and the information matrix address in the example of FIG. 1b would require—inter alia—a division by 3 that would slow down the access to the extended memory block.

Figure 2:
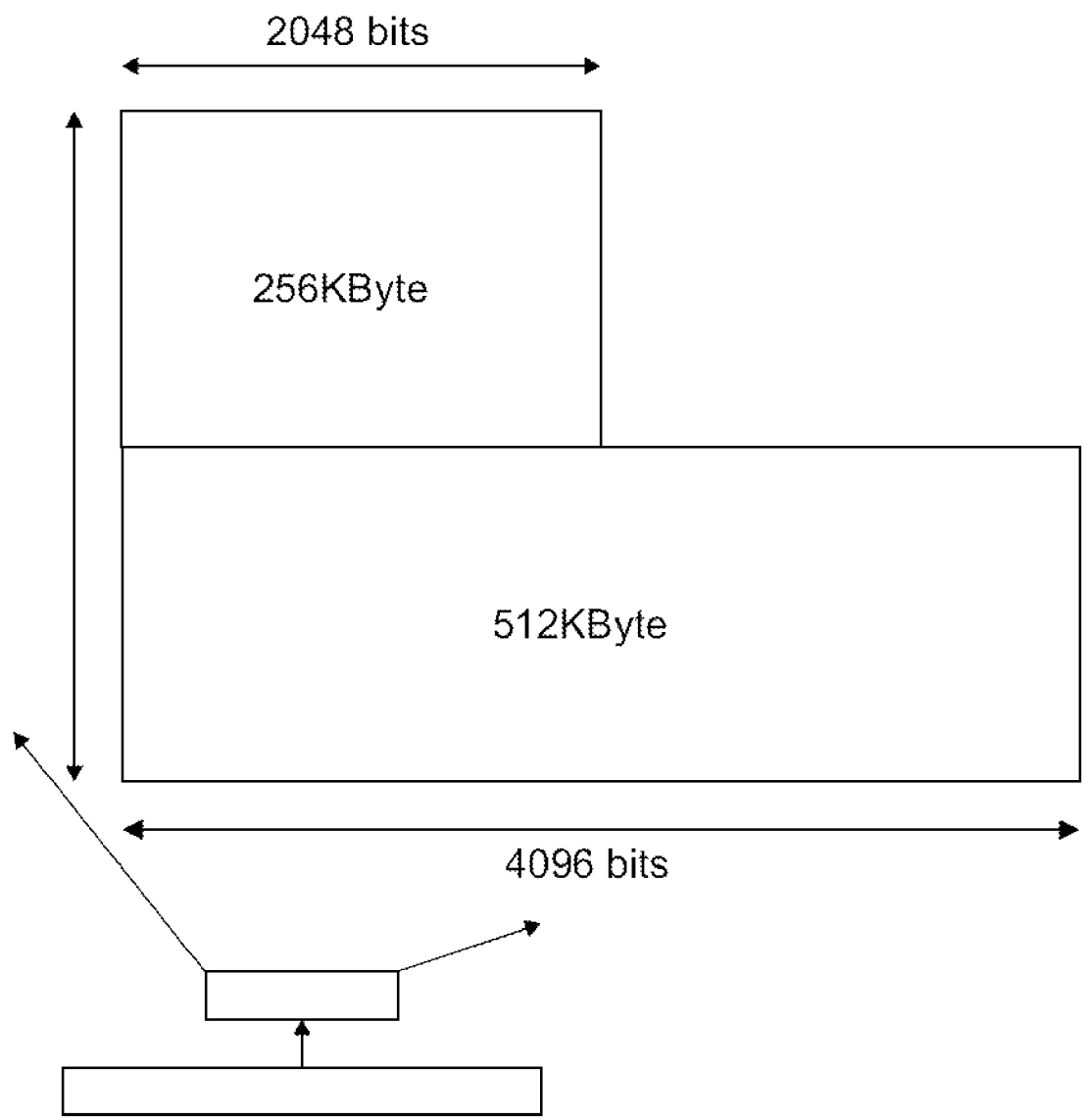
FIG. 2 shows a schematic visualization of a simplified addressing scheme for a memory device whose total memory capacity of 512 Kbytes is extendible by an additional memory capacity of 256 Kbytes or an improper fraction of $$\frac{p}{q} = \frac{3}{2}$$

Now, FIG. 2 shows a visualization of what may be done instead of the complex address conversion according to an embodiment. Obviously, the additional memory capacity of 256 Kbytes that results from the memory extension by the improper fraction $$\frac{3}{2}$$

corresponds to a binary fraction of the memory capacity of the original memory block in FIG. 1a, namely to one half. If the additional memory capacity corresponds to such a binary fraction and is regarded as a separate additional memory block, the addressing of the additional memory capacity may be greatly simplified. This is based on the fact that—as the binary fraction—the additional memory block may logically also be addressed by a binary based addressing scheme which merely uses bit selection processes and not address conversion calculations.

Unlike FIG. 2 suggests, the additional memory capacity of 256 Kbytes is not addressed by different wordlines, but rather by the same 1024 wordlines that address the original memory block of 512 Kbytes. In order words, the additional memory capacity may use the bitline address room above the original memory block of 512 Kbytes. Correspondingly, an extended memory block is formed with a total memory capacity of 768 Kbytes whose two lower thirds correspond to the original memory block of 512 Kbytes and whose upper third corresponds to the additional memory block of 256 Kbytes.

Hence, the visualization also suggests a general method to simplify the addressing of an original memory block that is extended by an improper fraction of $$\frac{p}{q}.$$

Namely, in a first step, a first remaining fraction of the memory capacity is determined as $$\left(\frac{p}{q} - 1\right)$$

that exceeds the memory capacity of the original memory block. In this regard, the first remaining fraction of the memory capacity may also be regarded as the additional memory capacity which is added to the total memory capacity of the original memory block by the extension by the improper fraction of $$\frac{p}{q}.$$

In the case of p=3 and q=2, the first remaining fraction may be determined as $$\left(\frac{p}{q} - 1\right) = \frac{1}{2}.$$

Then, the first remaining fraction is decomposed into binary fractions of the memory capacity of the original memory block that are less than or equal to the corresponding remaining fraction until the difference between a current remaining fraction and a current binary fraction is zero. Here, the first remaining fraction of the memory capacity is $$\frac{1}{2},$$

the first
binary fraction of the memory capacity of the original memory block is also $$\frac{1}{2}$$

so that the difference between the first remaining fraction and the first binary fraction is already zero. Thus, in the case of p=3 and q=2, the method already terminates after one iteration.

For this reason, FIG. 3 shows another visualization of the method to simplify the addressing of the original memory block with a memory capacity of 512 Kbytes that is extended by an improper fraction $$\frac{p}{q},$$

wherein p=7 and q=4. FIG. 3 shows how the method as indicated in FIG. 2 may be iterated for more complicated improper fractions $$\frac{p}{q}.$$

In this case, the first remaining fraction may be determined as $$\left(\frac{p}{q}-1\right)=\frac{3}{4}.$$

The first binary fraction of the memory capacity of the original memory block that is less than the first remaining fraction is again $$\frac{1}{2}.$$

Since, the difference between the first remaining fraction of $$\frac{3}{4}$$

and the first binary fraction of $$\frac{1}{2}$$

is not zero, a second remaining fraction may be generated as the difference between the first remaining fraction and the first binary fraction as $$\left(\frac{3}{4}-\frac{1}{2}\right)=\frac{1}{4}.$$

Then, the second remaining fraction may be decomposed into a second binary fraction of the memory capacity of the original memory block that is less or equal to the second remaining fraction. The second binary fraction may also be understood as binary fraction of second degree, i.e. as $$\left(\frac{1}{2}\right)^2=\frac{1}{4}.$$

Since the difference between the second remaining fraction and the second binary fraction is zero, the method terminates after two iterations.

In other words, in the embodiment of FIG. 3, the total additional memory capacity of 384 Kbytes which is the result of extending the memory capacity of the original memory block with a memory capacity of 512 Kbytes by a factor of $$\frac{p}{q}=\frac{7}{4}$$

may be decomposed into a first binary fraction of the memory capacity of the original memory block, namely half or 256 Kbytes, and a second binary fraction of the memory capacity of the original memory block, namely a quarter or 128 Kbytes.

Again, also in the embodiment of FIG. 3, the addressing of the additional memory capacity is greatly simplified based on the fact that as first and second binary fractions—the additional memory blocks of 256 Kbytes and 128 Kbytes may be addressed by a binary based addressing scheme which merely uses bit selection processes and not address conversion calculations. The binary addressing scheme may use decision stages for an address generation by bit segmentation.

Similar to FIG. 2, the total additional memory capacity of 384 Kbytes in the embodiment in FIG. 3 is not addressed by different wordlines, but rather by the same 1024 wordlines that address the original memory block of 512 Kbytes. In order words, the additional memory capacity uses the bitline address room above the original memory block of 512 Kbytes. Correspondingly, an extended memory block is formed with a total memory capacity of 896 Kbytes whose four lower seventh parts correspond to original memory block of 512 Kbytes, whose middle two seventh parts correspond to the first additional memory block of 256 Kbytes and whose upper seventh part corresponds to the second additional memory block of 128 Kbytes. In other words, the bitline address room of the total extended memory block in the embodiment in FIG. 3 is logically split into parts of sizes $2^0$, $2^{-1}$ and $2^{-2}$ with respect to the original bitline address room between 0 and 4095. Thus, the additional bitline address room covers the range from 4096 to (4096+4096/2+4096/4−1)=7167.

In a more complex and practically relevant example, the parameters of the memory device are chosen as $W=8192=2^{13}$, $B=512 \cdot i=2^{12}$, $N=256$, $P=288$. Moreover, it is assumed that the total memory capacity of the corresponding memory device is divided into 8 sectors of the same memory capacity, also referred to as sectors. In this embodiment, it may depend on the sector whether it is operated in the first operation mode with $p=q=1$ and a total memory capacity of 4,194,304 bits or in the second operation mode with $p=3$ and $q=2$ and a total extended memory capacity of $$\frac{3}{2} \cdot 4,$$

194,304 bits=6,291,456 bits without redundancy.

Then, the above-mentioned method to address an extended memory capacity may be generalized by treating each sector—except for the sector with the lowest address—as a virtual separate storage or memory device. Furthermore, an arithmetic logic unit may be introduced that may be used in conjunction with all the virtual memory devices. This arithmetic logic unit may determine when a certain sector is accessed and assign a corresponding access type—either a single bit access or a multi bit access—whichever should be used for the respective sector.

In an embodiment, the following settings as set out in Table 5 may be chosen for the operation modes to be used in the corresponding sectors:

TABLE 5

| sector | $p = q = 1$ | $p = 3, q = 2$ |
|---|---|---|
| 0 | x | |
| 1 | | x |
| 2 | | x |
| 3 | x | |
| 4 | | x |
| 5 | | x |
| 6 | | x |
| 7 | x | |

Correspondingly, for the detection of each sector in the embodiment of Table 5, the following Table 6 may apply:

TABLE 6

| sectors | C(s) | SA(s) | SAS(s) |
|---|---|---|---|
| 0 | 512 | 0x00000000 | 0 |
| 1 | 768 | 0x00080000 | 2 |
| 2 | 768 | 0x00140000 | 5 |
| 3 | 512 | 0x00200000 | 8 |
| 4 | 768 | 0x00280000 | 10 |
| 5 | 768 | 0x00340000 | 13 |
| 6 | 768 | 0x00400000 | 16 |
| 7 | 512 | 0x004C0000 | 19 |

As in the embodiment in Table 6, C(s) may refer to the total memory capacity of the corresponding sector in Kbytes and 256-bit words, SA(s) may refer to the resulting start address of the corresponding sector in the usual hexadecimal notation and SAS(s) may refer to the reduced significant part of the address that may be stored for the corresponding sector to reduce storage space requirements. Now, the wordline address may be derived from a reduced address WR=A−SA(s) according to the above described simplified addressing scheme.

In the embodiment according to Table 6 with sectors 0, 3 and 7 operating according to the first operation mode with $p=q=1$ and sectors 1, 2, 4, 5, 6 operating according to the second operation mode with $p=3$ and $q=2$, the connection lines for supplying the information along a wordline may be implemented using a multiplexer that feeds sets of 512·8/256=16 memory cells to a sense amplifier for the case that $p=q=1$ and 256-bit words. For the 288-bit words with redundancy, the set simply should be extended to $512 \cdot 8 \cdot 288/256^2=18$ memory cells that are fed to a sense amplifier. For the case that that $p=3$ and $q=2$, it follows that for 288 bit, only $$288 \cdot \frac{2}{3} = 192$$

memory cells have to be read out. However, the above-mentioned 16:1 multiplexer for the first operation mode translates into a 24:1 multiplexer $$\left(16 \cdot \frac{3}{2} = 24\right).$$

In the above embodiment, both systems of multiplexers should be implemented to enable the operation of the predetermined sectors of the multi-sector memory device in the first operation mode and the second operation mode simultaneously. Then, the sectors with a memory capacity of 512 Kbytes may be addressed by the conventional addressing scheme as soon as the start address of the corresponding sector has been subtracted for an access to the sector. In the described embodiment, the corresponding subtracter uses a width of five bits which can be derived from the bit resolution that is needed to binary represent the values of SAS(s). For the sectors with a memory capacity of 768 Kbytes, the two upper address bits AT after the subtraction may be used to perform the settings for wordlines and byte addresses as shown in Table 7:

TABLE 7

| AT | wordlines | Byte addresses |
|---|---|---|
| 0 | 0 ... 0x1FF | 0 ... 0x1FF |
| 1 | 0x200 ... 0x3FF | |
| 2 | 0 ... 0x3FF | 0x200 ... 0x2FF |

$$\frac{2}{3}$$

Now, Table 7 may be interpreted as follows: In the lower fraction of a sector, the lower $$\frac{2}{3}$$

fraction of the bitlines is read out, wherein all wordlines are involved. In the higher $$\frac{1}{3}$$

traction of a sector, the remaining higher $$\frac{1}{3}$$

fraction of the bitlines is read out. Also in the latter case, all wordlines may be addressed but now with the upper third of the bitlines. As the numbers for the embodiment above prove, all values may be derived in a simple way by mere bit selection from the access address after the above-mentioned subtraction.

FIG. 4 shows a further embodiment, wherein several memory sectors of configurable memory density are stacked. As in FIG. 4, the stack of the four sectors 400, 401, 402 and 403 may be determined by the sector addresses SAR0, SAR1, SAR2 and SAR3 and the modus registers MOD0, MOD1, MOD2 and MOD3. The simplified addressing scheme as described above may be performed within each one of sectors 400, 401, 402 and 403.

The modus registers may select single bit, i.e. the first operation mode or multi bit, i.e. second operation mode for each sector. The bit length of the sector addresses may directly depend on the improper fraction $$\frac{p}{q}$$

by which the memory capacity of a sector operated in the multi bit mode is extended.

Based on the sector addresses and modus registers, a sector detection may be implemented with simple logic. This holds true also for more complicated improper fractions as in the embodiment of FIG. 3, wherein p=7 and q=4 with accordingly more complex logic.

FIG. 5 shows a flow diagram of a method for simplified addressing of a memory device whose total memory capacity is extendible by an additional memory capacity or a factor to a total extended memory capacity. The method comprises the step of dividing the additional memory capacity into a set of binary memory fractions of the total memory capacity such that a sum of all binary memory fractions equals the additional memory capacity.

In a further step, the method comprises addressing each one of the binary memory fractions by a binary based addressing scheme. According to an embodiment, the factor corresponds to an improper fraction $$\frac{p}{q} \cdot \text{with} \quad q = 2^k;$$

q<p<2q and p, q and k being integers.

So far, in all of the above-mentioned embodiments, addressing schemes have been considered for memory architectures in which sets of q memory cells store p≥q bits of information. However, the suggested addressing schemes may easily be transferred to memory architectures in which sets of q memory cells store p≤q bits of information. In fact, an addressing scheme which is adequate for such cases with $$\frac{p}{q} \le 1$$

may be defined by simply choosing the factor for the memory enlargement as $$\frac{q}{p} \ge 1$$

in the above described addressing schemes.

Of course, a plurality of sets of values for p and q may be used in the same memory device, the simplified addressing scheme is insofar extendible. A limitation might apply in the application of the simplified addressing scheme to nonvolatile memories, that may only be deleted in a certain way. Frequently, only the memory cells of entire wordlines may be deleted simultaneously. When using the above described simplified addressing scheme, delete operations could possibly lead to ranges that are discontiguous with respect to addressing. For applications, such a situation is often undesirable. However, the application of the simplified addressing scheme to nonvolatile memories is merely limited in the regard that only entire sectors according to the above embodiment may be deleted. However, this might be required anyway to other technical reasons (so called disturbs).

In summary, a method has been presented based on which memory devices with variable information density with regard to the contents of their memory cells may be managed while avoiding otherwise resulting arithmetical problems with respect to addressing. A basic principle may be that—with respect to the simple operation or storage mode of one memory cell containing one bit with respect to the simple operation mode of one memory cell containing one bit—the resulting additional memory capacity on the bitlines is shifted in the address room behind that one of the simple storage mode.

With respect to the above-described embodiments which relate to the Figures, it is emphasized that the embodiments basically served to increase the comprehensibility. In addition to that, the following further embodiments try to illustrate a more general concept. However, also the following embodiments are not to be taken in a limiting sense. Rather—as expressed before—the scope of the present disclosure is defined by the appended claims.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this invention be limited only by the claims and the equivalents thereof.

What is claimed is:

1. A method for simplified addressing of memory cells in a memory device organized in a memory matrix comprising W wordlines and $$\frac{p}{q} \cdot B$$

bitlines, wherein W, B, p and q are integers, the memory capacity of the memory device being selectable between a total memory capacity of C=W·B bits in a first operation mode, and a total extended memory capacity of $$C_e = W \cdot \left(\frac{p}{q} \cdot B\right)$$

bits in at least one second operation mode with $q=2^k$; $q<p<2q$; the method comprising:
dividing an additional memory capacity $C_a=C_e-C$ into a set of memory parts with partial memory capacities that correspond to binary fractions of the total memory capacity $C_i=W \cdot B/2^i$ such that a sum of all partial memory capacities equals the additional memory capacity, $$\sum_{i=0}^{K} C_i = C_a;$$

and
addressing each one of the set of memory parts by a binary based addressing scheme to avoid an arithmetical complexity in addressing the $$\left(\frac{p}{q} \cdot B\right)$$

bits per wordline in the second operation mode.

2. The method of claim 1, wherein:
the memory device comprises a plurality of sectors, wherein a memory capacity of each sector s is selectable according to a sector specific memory extension fraction $$\frac{p}{q}(s).$$

3. The method of claim 2, further comprising:
addressing a memory cell in a predetermined sector sp of the plurality of sectors according to the simplified addressing scheme of claim 1 based on a sector specific start address SA(sp) which is a function of the predetermined sector's memory capacity C(sp) and its sector specific memory extension fraction $$\frac{p}{q}(sp).$$

4. The method of claim 1, wherein:
the memory cells of the additional memory capacity $C_a$ are located along the W wordlines and a range of bitlines from $$B \text{ to } \frac{p}{q} \cdot B - 1.$$

5. A memory device organized in a memory matrix comprising W wordlines and $$\frac{p}{q} \cdot B$$

bitlines, wherein W, B, p and q are integers, the memory capacity of the memory device being selectable between a total memory capacity of C=W·B bits in a first operation mode, and a total extended memory capacity of $$C_e = W \cdot \left(\frac{p}{q} \cdot B\right)$$

bits in at least one second operation mode with $q=2^k$; $q<p<2q$; the memory device configured to:
divide an additional memory capacity $C_a=C_e-C$ into a set of memory parts with partial memory capacities that correspond to binary fractions of the total memory capacity $C_i=W \cdot B/2^i$ such that a sum of all partial memory capacities equals the additional memory capacity, $$\sum_{i=0}^{K} C_i = C_a;$$

and
address each one of the set of memory parts by a binary based addressing scheme to avoid an arithmetical complexity in addressing the $$\left(\frac{p}{q} \cdot B\right)$$

bits per wordline in the second operation mode.

6. The memory device of claim 5, comprising a plurality of sectors, wherein a memory capacity of each sector s is selectable according to a sector specific memory extension fraction $$\frac{p}{q}(s).$$

7. The memory device of claim 6, configured to:

address a memory cell in a predetermined sector sp of the plurality of sectors according to the simplified addressing scheme as implemented in the memory device of claim 5 based on a sector specific start address SA(sp) which is a function of the predetermined sector's memory capacity C(sp) and its sector specific memory extension fraction $$\frac{p}{q}(sp).$$

8. The memory device of claim 5, wherein:

the memory cells of the additional memory capacity $C_a$ are located along the W wordlines and a range of bitlines from B to $$\frac{p}{q} \cdot B - 1.$$

9. A method for simplified addressing of a memory device whose total memory capacity is extendible by an additional memory capacity or a factor to a total extended memory capacity, the memory device comprising a plurality of memory cells, the method comprising:

dividing the additional memory capacity into a set of binary memory fractions of the total memory capacity such that a sum of all binary memory fractions equals the additional memory capacity;

addressing each one of the binary memory fractions by a binary based addressing scheme; and storing more than one bit of information in at least one of the plurality of memory cells to extend the total memory capacity to the total extended memory capacity.

10. The method of claim 9, wherein sets of q memory cells store p≥q bits of information and the factor corresponds to an improper fraction $$\frac{p}{q} \cdot \text{ with } q = 2^k;$$

q<p<2q and p, q and k being integers.

11. The method of claim 9, wherein the memory device comprises a plurality of sectors, wherein a memory capacity of each sector s is selectable according to a sector specific memory extension fraction $$\frac{p}{q}(s).$$

12. The method of claim 11, further comprising:

addressing a memory cell of the memory device in a predetermined sector sp of the plurality of sectors according to the simplified addressing scheme of claim 9 based on a sector specific start address SA(sp) which is a function of the predetermined sector's memory capacity C(sp) and its sector specific memory extension fraction $$\frac{p}{q}(sp).$$

13. The method of claim 9, wherein sets of q memory cells store p≥q bits of information and the factor corresponds to an improper fraction $$\frac{q}{p} \cdot \text{ with } p = 2^k;$$

p<q<2p and p, q and k being integers.

* * * * *